United States Patent
Kim et al.

(10) Patent No.: US 10,495,682 B2
(45) Date of Patent: Dec. 3, 2019

(54) APPARATUS AND METHOD FOR PREDICTING FAULT STATE OF INVERTER

(71) Applicants: HYUNDAI MOTOR COMPANY, Seoul (KR); Seoul National University R&DB Foundation, Seoul (KR)

(72) Inventors: Deog Hyeon Kim, Ulsan (KR); Yong Un Cho, Ulsan (KR); Yongchae Lim, Ulsan (KR); Byeng Dong Youn, Seoul (KR); Hyunseok Oh, Seoul (KR); Junmin Lee, Seoul (KR)

(73) Assignees: Hyundai Motor Company, Seoul (KR); Seoul National University R&DB Foundation, Seoul (KR)

( * ) Notice: Subject to any disclaimer, the term of this patent is extended or adjusted under 35 U.S.C. 154(b) by 329 days.

(21) Appl. No.: 15/384,266

(22) Filed: Dec. 19, 2016

(65) Prior Publication Data

US 2018/0045771 A1 Feb. 15, 2018

(30) Foreign Application Priority Data

Aug. 11, 2016 (KR) .................. 10-2016-0102214

(51) Int. Cl.
| | | |
|---|---|---|
| *H02M 3/135* | (2006.01) | |
| *H02M 1/38* | (2007.01) | |
| *H02P 21/22* | (2016.01) | |
| *G01R 31/26* | (2014.01) | |
| *H02H 7/122* | (2006.01) | |
| *G01R 31/42* | (2006.01) | |
| *G01R 31/327* | (2006.01) | |

(52) U.S. Cl.
CPC ......... *G01R 31/2617* (2013.01); *G01R 31/42* (2013.01); *H02H 7/1225* (2013.01); *H02H 7/1227* (2013.01); *G01R 31/3277* (2013.01)

(58) Field of Classification Search
CPC .................. H01L 24/45; H02M 7/48
See application file for complete search history.

(56) References Cited

U.S. PATENT DOCUMENTS

| | | | | |
|---|---|---|---|---|
| 2012/0248864 A1* | 10/2012 | Ioannidis | ............... | H02H 9/001 307/9.1 |
| 2014/0021893 A1* | 1/2014 | Komatsu | .................. | H02H 3/08 318/400.22 |
| 2014/0111253 A1* | 4/2014 | Fukuta | .................. | H03K 17/00 327/109 |

FOREIGN PATENT DOCUMENTS

| | | |
|---|---|---|
| JP | 2009-204600 A | 9/2009 |
| JP | 2011-10480 A | 1/2011 |
| JP | 4984746 B2 | 7/2012 |
| KR | 20-0409218 Y1 | 2/2006 |
| KR | 10-2009-0125481 A | 12/2009 |
| KR | 10-2010-0063339 A | 6/2010 |
| KR | 10-2015-0062047 A | 6/2015 |

(Continued)

*Primary Examiner* — Bickey Dhakal
*Assistant Examiner* — Charles S Laughlin
(74) *Attorney, Agent, or Firm* — Knobbe Martens Olson & Bear LLP

(57) ABSTRACT

Disclosed are an apparatus and a method for predicting a fault state of an inverter. The apparatus for predicting a fault state of an inverter includes: an inverter converting DC power into AC power; a switching element provided in the inverter; and a controller extracting a fault sign factor based on an output signal output from the inverter and predicting a fault of the switching element based on the fault sign factor.

16 Claims, 5 Drawing Sheets

(56) References Cited

FOREIGN PATENT DOCUMENTS

KR  10-2015-0071576 A  6/2015

\* cited by examiner

APPARATUS AND METHOD FOR PREDICTING FAULT STATE OF INVERTER

CROSS-REFERENCE TO RELATED APPLICATION

This application claims priority to and the benefit of Korean Patent Application No. 10-2016-0102214 filed in the Korean Intellectual Property Office on Aug. 11, 2016, the entire contents of which are incorporated herein by reference.

BACKGROUND (a) Field

The present disclosure relates to an apparatus for predicting a fault state of an inverter, and particularly, to an apparatus and a method for predicting a fault state of an inverter, which can pre-diagnose a fault state of a switching element included in the inverter based on an output signal output from the inverter.

(b) Description of the Related Art

In recent years, in vehicles using a combustion type engine, other types of vehicles which are environment-friendly and consider fuel efficiency, that is, a hybrid vehicle or an electric vehicle have been actively researched and developed.

In the hybrid vehicle, the existing engine and a driving motor driven with electric energy are associated with each other to drive the vehicle with two driving sources. The electric vehicle is driven only by a driving motor driven with the electric energy. The vehicles have held the prominent position as realistic alternative next-generation vehicles which have come into the spotlight worldwide due to an effect of improvement of fuel efficiency together with reduction of environmental pollution by exhaust gas.

The vehicles include an inverter for controlling the driving motor.

The inverter switches DC power by using a switching element and converts and outputs the DC power into AC power. The inverter controls a switching time of the switching element to control the driving motor.

The switching element used for the inverter adopts a transistor, a metal oxide silicon field effect transistor (MOSFET), an insulated gate bipolar transistor (IGBT), and the like. However, the transistors have a disadvantage in that a circuit configuration is complicated and an operation speed is low instead of a low price and the MOSFET has a disadvantage in that efficiency decreases in high voltage instead of a high operation speed. As a result, since the IGBT has advantages of the transistor and the MOSFET, the IGBT has been recently used a lot.

In the related art, since a deterioration state of the switching element cannot be pre-diagnosed and the deterioration state can be sensed after a fault occurs, a problem occurs, in which the vehicle cannot be driven in the worst case.

The disclosure of this section is to provide background of the invention. Applicant notes that this section may contain information available before this application. However, by providing this section, Applicant does not admit that any information contained in this section constitutes prior art.

SUMMARY

An aspect of the invention provides a system and method for providing an alarm to a driver of a hybrid or electric vehicle regarding a potential deterioration of insulated gate bipolar transistor (IGBT) in an inverter for providing electrical power to a wheel driving motor the vehicle. A computerized controller installed in the vehicle obtains and monitors at least one voltage or current of the IGBT while driving of the vehicle. In embodiments, the controller monitors a voltage between a gate and an emitter ($V_{GE}$) of the IGBT, a voltage between a collector and the emitter ($V_{CE}$) of the IGBT, and a current at the collector of the IGBT simultaneously.

In embodiments, using the monitored voltage(s) and currents(s), the controller computes a minimum value of the gate-emitter voltage ($V_{GE(th)}$ in FIG. 2 to turn on the IGBT) which makes the collector current greater than a predetermined current. In embodiments, the predetermined current for determining $V_{GE(th)}$ is a minimum current representing a 'on state' of the IGBT. In embodiments, using the monitored voltage(s) and currents(s) of the IGBT, the controller determines a first response time ($t_{on(square)}$ in FIG. 2) of the IGBT representing a time from an input of a step function of gate-emitter voltage ($V_{GE}$) until a subsequent turning on of the IGBT. In embodiments, using the monitored voltage(s) and currents(s) of the IGBT, the controller determines a second response time ($t_{on(ramp)}$ in FIG. 4) of the IGBT representing a time from an input of ramp function of gate-emitter voltage ($V_{GE}$) until a subsequent turning on of the IGBT. In embodiments, the controller repeatedly or periodically updates the first response time, the second response time and the minimum gate-emitter voltage $V_{GE(th)}$, when the vehicle operates.

In embodiments, using at least one from the computed minimum gate-emitter voltage ($V_{GE(th)}$), the first response time and the second response time, the controller determines whether at least one from a predetermined set of deterioration diagnosis criteria has been satisfied. When at least one deterioration diagnosis criterion has been satisfied, the controller stores the event in a memory connected to the controller and generate a corresponding warning to the driver.

In embodiments, when the first response time $t_{on\ (square)}$ is greater than a first predetermined reference and the second response time $t_{on(ramp)}$ is less than a second predetermined reference, the controller cause a display or a speaker (warning unit 120) of the vehicle to provide a first level warning (visual or sound alarm). Subsequently, when a second on time $t_{on(ramp)}$ becomes greater than the second predetermined reference value and when the threshold voltage $V_{GE(th)}$ is greater than a third predetermined reference, the controller cause the display or the speaker of to provide a second level warning that is more significant than the first level warning. Subsequently, when the threshold voltage $V_{GE(th)}$ becomes smaller than the third predetermined reference, the controller causes a third level warning that is more significant than the second level warning.

Embodiments the present invention provides an apparatus for predicting a fault state of an inverter, including: a switching element provided in the inverter; and a controller extracting a fault sign factor based on an output signal output from the inverter and predicting a fault of the switching element based on the fault sign factor.

The controller may include a collection unit collecting the output signal output to the inverter, an extraction unit extracting the fault sign factor including at least one of threshold voltage, a first on time, and a second on time from the output signal, and a fault diagnosing unit predicting the fault of the switching element based on the fault sign factor.

The threshold voltage may be voltage between a gate and an emitter of the switching element, which is required for turning on the switching element.

The first on time may be a time required for the switching element to be turned on when a signal having a square waveform is input in the gate of the switching element.

The second on time may be a time required for the switching element to be turned on when a signal having a triangular waveform is input in the gate of the switching element.

The fault diagnosing unit may determine whether the first on time is equal to or more than a first reference value, determine whether the first on time is equal to or more than a second reference value when the first on time is equal to or more than the first reference value, and diagnose a state of the switching element as a first deterioration state when the second on time is less than the second reference value.

The fault diagnosing unit may determine whether the threshold voltage is equal to or less than a third reference value when the second on time is equal to or more than the second reference value and diagnose the state of the switching element as a second deterioration state when the threshold voltage is more than a third reference value.

The fault diagnosing unit may diagnose the state of the switching element as a third deterioration state when the threshold voltage is equal to or less than the third reference value.

The controller may determine that the switching element is in a fault state when output current of the output signal is equal to or more than reference current.

The switching element may be an insulated gate bipolar transistor (IGBT).

The controller may control a warning unit to output result information to predict the fault of the switching element.

Another embodiment of the present invention provides a method for predicting a fault state of an inverter, including: collecting an output signal output from an IGBT provided in the inverter; extracting a fault sign factor including at least one of threshold voltage, a first on time, and a second on time from the output signal; and predicting a fault of the IGBT based on the fault sign factor.

The threshold voltage may be voltage between a gate and an emitter of the IGBT, which is required for turning on the IGBT.

The first on time may be a time when the IGBT is turned on when a signal having a square waveform is input in the gate of the IGBT and the second on time may be a time when the IGBT is turned on when the signal having the square waveform is input in the gate of the IGBT.

The predicting of the fault of the IGBT based on the fault sign factor may include, determining whether the first on time is equal to or more than a first reference value, determining whether the second on time is equal to or more than a second reference value when the first on time is equal to or more than the first reference value, and diagnosing a state of the IGBT as a first deterioration state when the second on time is less than the second reference state.

The predicting of the fault of the IGBT based on the fault sign factor may further include, determining whether the threshold voltage is equal to or less than a third reference value when the second on time is equal to or more than the second reference value, and diagnosing a state of the IGBT as a second deterioration state when the threshold voltage is more than the third reference value.

The predicting of the fault of the IGBT based on the fault sign factor may further include diagnosing the state of the IGBT as a third deterioration state when the threshold voltage is equal to or less than the third reference value.

The predicting of the fault of the IGBT based on the fault sign factor may include determining that the IGBT is in the fault state when output current of the fault sign factor is equal to or more than reference current.

The method may further include outputting result information to predict the fault of the IGBT.

According to embodiments of the present invention, since a deterioration state of a switching element can be pre-diagnosed, durability of the switching element can be improved.

Further, since a fault state of the switching element included in an inverter can be pre-diagnosed based on an output signal output from the inverter, stability at the time of driving a driving motor and reliability of a production line can be improved.

Besides, an effect which can be obtained or predicted by embodiments of the present invention is directly or implicitly disclosed in detailed description of embodiments of the present invention. That is, various effects predicted according to embodiments of the present invention will be disclosed in the detailed description to be described below.

DETAILED DESCRIPTION OF THE EMBODIMENTS

Hereinafter, embodiments of an apparatus and a method for predicting a fault state of an inverter according to embodiments of the present invention will be described in detail with reference to the accompanying drawings and descriptions. However, the drawings to be described below and the following detailed description relate to embodiments of the present invention. Accordingly, the present invention should not be limited only to the drawings and description given below.

Further, hereinbelow, in describing the present invention, detailed description of associated known function or constitutions will be omitted if it is determined that they unnecessarily make the gist of the present invention unclear. In addition, terms as terms which are specially defined in consideration of functions in the present invention may vary depending on the intention or usual practice of a user or an operator. Accordingly, the terms need to be defined based on contents throughout the present invention.

Further, in embodiments given below, terms will be appropriately modified, integrated, or separated so as to be apparently appreciated by those skilled in the art in order to efficiently describe core technical features of the present invention, but the present invention is not particularly limited thereto.

Hereinafter, embodiments of the present invention will be described below in detail with reference to the accompanying drawings.

Figure 1:
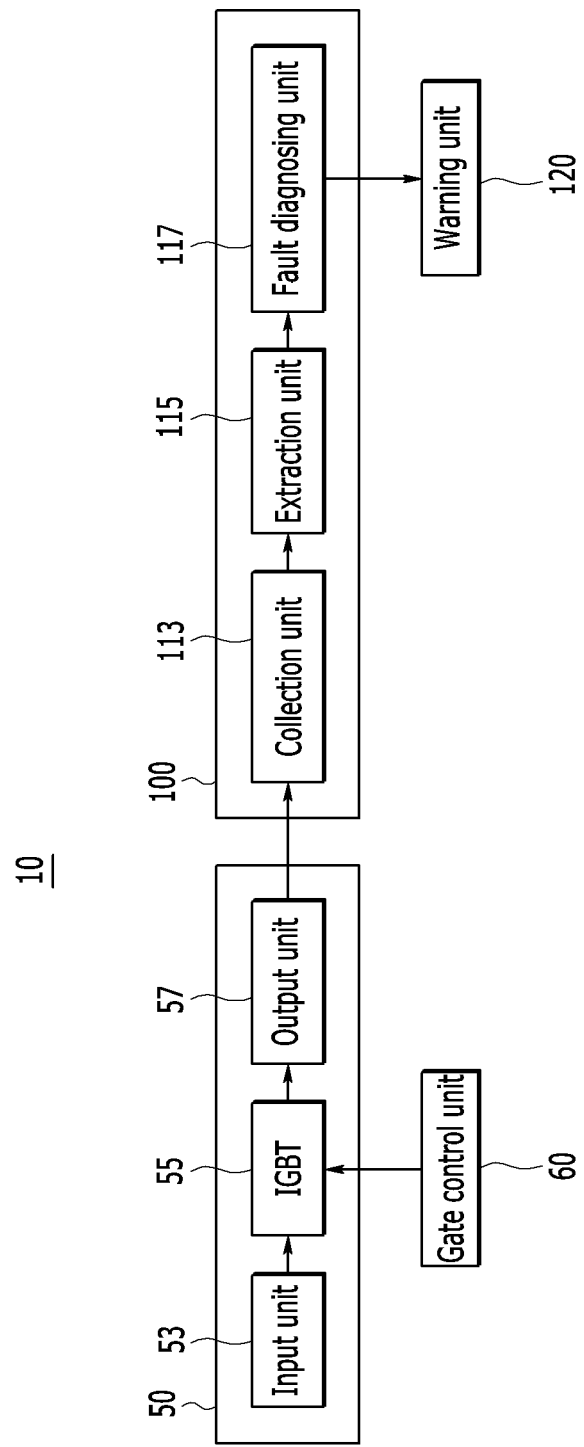
FIG. 1 is a diagram illustrating an apparatus for predicting a fault state of an inverter according to an embodiment of the present invention.
Figure 2:
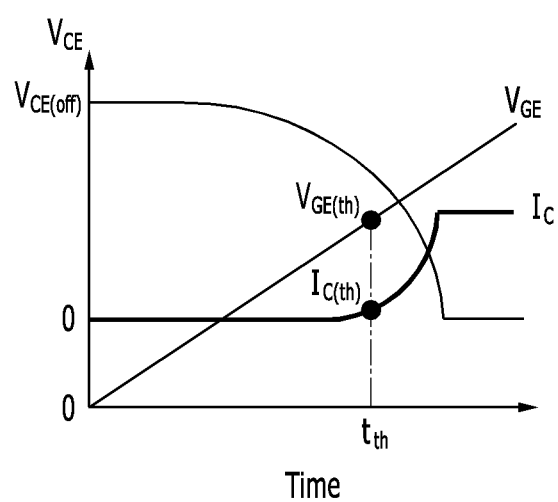
FIG. 2 is a graph for describing threshold voltage according to an embodiment of the present invention.
Figure 3:
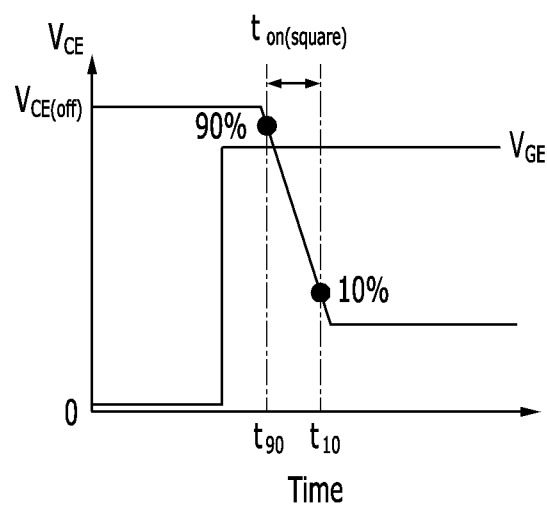
FIG. 3 is a graph for describing a first on time according to an embodiment of the present invention.
Figure 4:
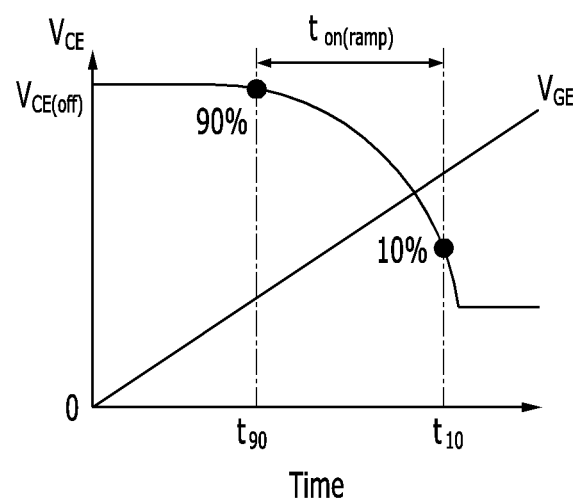
FIG. 4 is a graph for describing a second on time according to an embodiment of the present invention.

FIG. 1 is a diagram illustrating an apparatus for predicting a fault state of an inverter according to an embodiment of the present invention, FIG. 2 is a graph for describing threshold voltage according to an embodiment of the present invention, FIG. 3 is a graph for describing a first on time according to an embodiment of the present invention, and FIG. 4 is a graph for describing a second on time according to an embodiment of the present invention.

Referring to FIG. 1, the apparatus 10 for predicting a fault state of an inverter includes an inverter 50, a gate control unit 60, a controller 100, and a warning unit 120.

The inverter switches a switching element and converts and outputs DC power into AC power. Hereinafter, the switching element will be described to be referred to as an insulated gate bipolar transistor (IGBT) 55.

The inverter 50 includes an input unit 53, the switching element, and an output unit 57.

The input unit 53 receives the DC power and outputs the DC power to the IGBT 55.

The IGBT 55 receives the DC power through the input unit 53. The IGBT 55 is switched according to a control of the gate control unit 60.

The output unit 57 outputs an output signal acquired by converting the DC power into the AC.

The controller 100 extracts a fault sign factor based on the output signal output from the inverter 50 and predicts a fault of the IGBT 55 based on the fault sign factor. To this end, the controller 100 includes a collection unit 113, an extraction unit 115, and a fault diagnosis unit 117.

The collection unit 113 collects the output signal output from the inverter 50. That is, the collection unit 113 may collect the output signal output through the output unit 57 of the inverter 50.

The extraction unit 115 extracts the fault sign factor of the output signal.

Herein, the fault sign factor may represent a factor required for predicting the fault of the IGBT 55. The fault sign factor includes at least one of threshold voltage $V_{GE(th)}$, a first on time $t_{on(square)}$, and a second on time $t_{on(ramp)}$.

The threshold voltage $V_{GE(th)}$ is a voltage between a gate and an emitter of the IGBT 55 required for turning on the IGBT 55.

For example, the threshold voltage $V_{GE(th)}$ may be the voltage between the gate and the emitter at a time $t_{th}$ when collector current $I_{C(th)}$ starts to flow as illustrated in FIG. 2. Herein, the collector current $I_{C(th)}$ may represent minimum current that flows when the IGBT 55 is turned on. In general, a case where current having a specific value flows on a collector of the IGBT 55 is defined as an on state of the IGBT 55 and the definition called is a constant current method.

The first on time $t_{on(square)}$ is a time for the IGBT 55 to be turned on when a signal having a square waveform is input in the gate of the IGBT 55.

For example, the first on time $t_{on(square)}$ may represent a time required when voltage $V_{CE}$ between the collector and the emitter is changed from a first set value (90% of voltage $V_{CE(off)}$ in an off state of the IGBT 55) to a second set value (10% of the voltage $V_{CE(off)}$) in an interval in which the IGBT 55 is transited from the off state to the on state when the signal having the square waveform is input in the gate of the IGBT 55 as illustrated in FIG. 3. That is, the first on time $t_{on(square)}$ may be calculated based on a time $t_{90}$ when the voltage $V_{CE}$ between the collector and the emitter becomes the first set value and a time $t_{10}$ when the voltage $V_{CE}$ between the collector and the emitter becomes the second set value as illustrated in FIG. 3.

The second turn-on time $t_{on(ramp)}$ is a time for the IGBT 55 to be turned on when a signal having a triangular waveform is input in the gate of the IGBT 55.

For example, the second turn-on time $t_{on(ramp)}$ may represent a time required when the voltage $V_{CE}$ between the collector and the emitter is changed from the first set value to the second set value in the interval in which the IGBT 55 is transited from the off state to the on state when the signal having the triangular waveform is input in the gate of the IGBT 55 as illustrated in FIG. 4. That is, the second on time $t_{on(square)}$ may be calculated based on a time $t_{90}$ when the voltage $V_{CE}$ between the collector and the emitter becomes the first set value and a time $t_{10}$ when the voltage $V_{CE}$ between the collector and the emitter becomes the second set value as illustrated in FIG. 4.

Meanwhile, in FIGS. 3 and 4, it is described that the first set value is 90% of voltage $V_{CE(off)}$ and the second set value is 10% of voltage $V_{CE(off)}$ as an example, but the present invention is not limited thereto.

The fault diagnosing unit 117 predicts the fault of the IGBT 55 based on the fault sign factor. That is, the fault diagnosing unit 117 may diagnose a state of the IGBT 55 by comparing the fault sign factor with a predetermined reference value.

In detail, the fault diagnosing unit 117 diagnoses the state of the IGBT 55 as a first deterioration state when the first on time $t_{on(square)}$ of the fault sign factor is equal to or more than a first reference value and the second on time $t_{on(ramp)}$ is less than a second reference value.

The fault diagnosing unit 117 diagnoses the state of the IGBT 55 as a second deterioration state when the second on time $t_{on(ramp)}$ is equal to or more than a second reference value and the threshold voltage $V_{GE(th)}$ is more than a third reference value. The fault diagnosing unit 117 diagnoses the state of the IGBT 55 as a third deterioration state when the threshold voltage $V_{GE(th)}$ is equal to or less than the third reference value.

Herein, the first reference value to the third reference value may be predetermined values for predicting the fault of the IGBT 55. The first deterioration state may be a state in which the IGBT 55 starts to deteriorate, the second deterioration state may be a state in which the IGBT 55 progresses to deteriorate, and the third deterioration state may be a state in which the deterioration of the IGBT 55 is completed and the IGBT 55 needs to be replaced.

For such a purpose, the controller 100 may be implemented by one or more processors that operate by a set program and the set program may include a series of commands for performing each step included in a method for predicting a fault state of an inverter according to an embodiment of the present invention to be described below. The method for predicting the fault state of the inverter 50 will be described in more detail with reference to FIG. 5 given below.

The warning unit 120 outputs result information predicted by the fault diagnosing unit 117. That is, the warning unit 120 may display the result information according to the control of the fault diagnosing unit 117 or output the result information through a voice. To this end, the warning unit 120 may include at least one of a display device and a speaker. When the display device may display the result information, a type of the display device is irrespective. For example, the display device may be a navigation device, a cluster, an audio video navigation (AVN), and the like. The cluster is installed in an instrument panel that announces information on the vehicle, which includes a vehicle speed, an engine RPM, cooling water, and the like to a driver while driving the vehicle.

Hereinafter, the method for predicting a fault state of the inverter 50 according to an embodiment of the present invention will be described with reference to FIG. 5.

Figure 5:
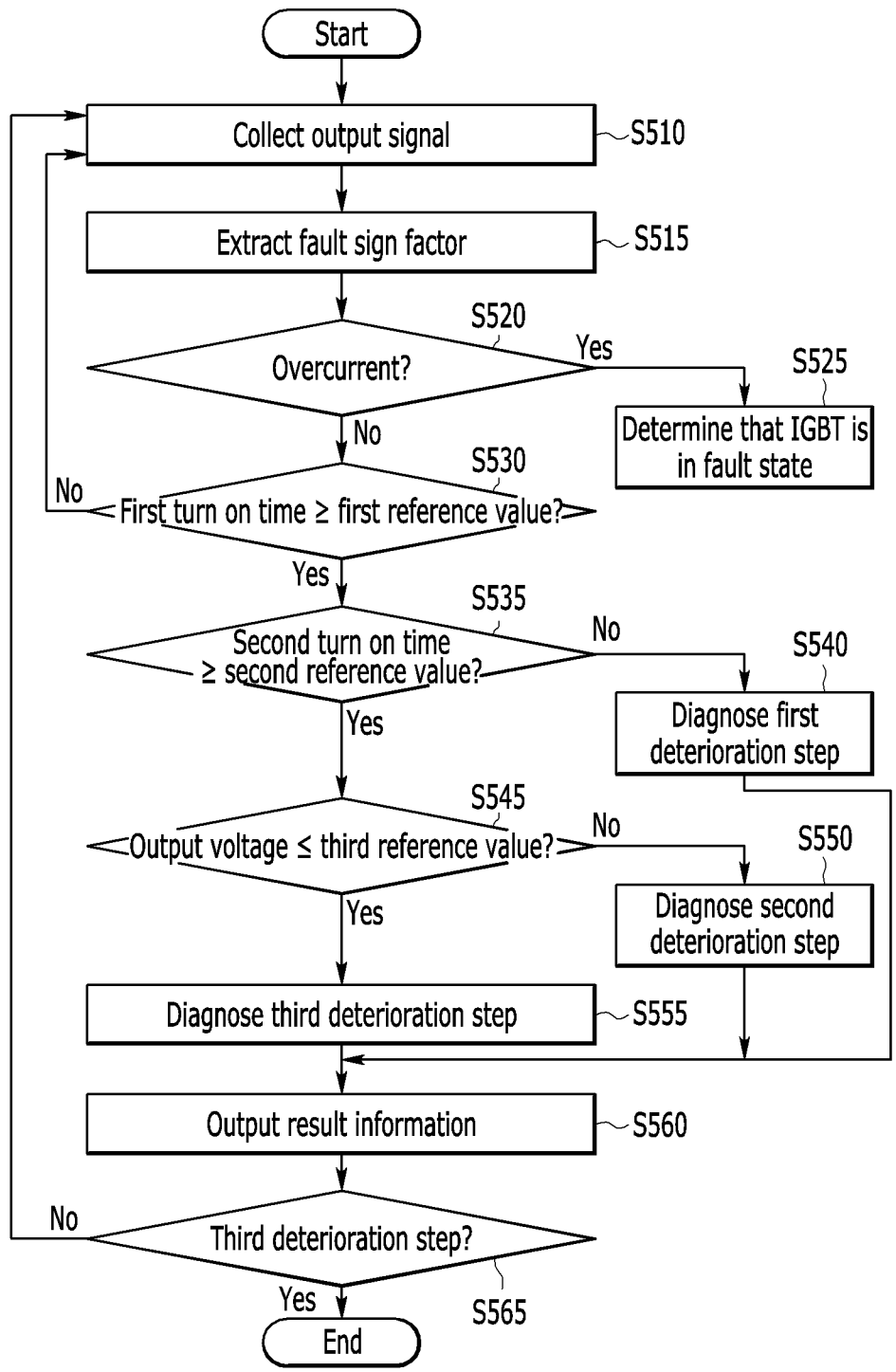
FIG. 5 is a flowchart illustrating a method for predicting a fault state of an inverter according to an embodiment of the present invention.

FIG. 5 is a flowchart illustrating a method for predicting a fault state of an inverter according to an embodiment of the present invention. As described above, the components of the controller 100 according to an embodiment of the present invention described with reference to FIG. 1 may be integrated or subdivided. Therefore, it is apparent that the component that performs the aforementioned function may become the component of the controller 100 according to an embodiment of the present invention regardless of the corresponding name. Accordingly, hereinafter, the method for predicting a fault state of an inverter according to an embodiment of the present invention will be described by using the controller 100 as a main agent of each step in describing the method for predicting a fault state of an inverter according to an embodiment of the present invention.

Referring to FIG. 5, the controller 100 collects the output signal output from the IGBT 55 of the inverter 50 (S510).

The controller 100 extracts the fault sign factor from the output signal (S515). That is, the controller 100 extracts the fault sign factor including the threshold voltage $V_{GE(th)}$, the first on time $t_{on(square)}$, and the second on time $t_{on(ramp)}$.

The controller 100 determines whether overcurrent flows on the IGBT 55 based on the output signal (S520). In other words, the controller 100 determines whether output current of the output signal is equal to or more than reference current. In this case, the reference current is a predetermined value as a value which becomes a reference in order to determine whether the overcurrent flows on the IGBT 55.

The controller 100 determines that the IGBT 55 is in the fault state when the output current is equal to or more than the reference current (S525).

When the output current is less than the reference current, the controller 100 determines whether the first on time $t_{on(square)}$ is equal to or more than the first reference value (S530).

When the first on time $t_{on(square)}$ is less than the first reference value in step S530, the controller 100 returns to step S510 to collect the output signal output from the inverter 50.

When the first on time $t_{on(square)}$ is equal to or more than the first reference value in step S530, the controller 100 determines whether the second on time $t_{on(ramp)}$ is equal or more than the second reference value (S535).

When the second on time $t_{on(ramp)}$ is less than the second reference value in step S535, the controller 100 diagnoses the state of the IGBT 55 as the first deterioration state (S540). Herein, the first deterioration state may be a state in which the IGBT 55 starts to deteriorate.

When the second on time $t_{on(ramp)}$ is equal to or more than the second reference value in step S535, the controller 100 determines the threshold voltage $V_{GE(th)}$ is equal to or less than the third reference value (S545).

When the threshold voltage $V_{GE(th)}$ is more than the third reference value in step S545, the controller 100 diagnoses the state of the IGBT 55 as the second deterioration state (S550). In this case, the second deterioration state may be a state in which the IGBT 55 progresses to deteriorate.

When the threshold voltage $V_{GE(th)}$ is equal to or less than the third reference value in step S545, the controller 100 diagnoses the state of the IGBT 55 as the third deterioration state (S555). Herein, the third deterioration state may be a state in which the IGBT 55 starts to deteriorate and the IGBT 55 needs to be thus replaced.

The controller 100 controls the warning unit 120 so as to output the result information of the IGBT 55 (S560). That is, the warning unit 120 may output the first deterioration state diagnosed in step S540 according to the control of the control unit and output the second deterioration state diagnosed in step S550. Further, the warning unit 120 may output the third deterioration state diagnosed in step S555 according to the control of the control unit. In addition, the warning unit 120 may output an event a message indicating replacing the IGBT 55 while outputting the third deterioration state.

While this invention has been described in connection with what is presently considered to be its embodiments, it is to be understood that the invention is not limited to the disclosed embodiments, but, on the contrary, is intended to cover various modifications and equivalent arrangements.

DESCRIPTION OF SYMBOLS

10: Apparatus for predicting fault state of inverter
50: Inverter
55: IGBT
60: Gate control unit
100: Controller
113: Collection unit
115: Extraction unit
117: Fault diagnosing unit
120: Warning unit

What is claimed is:
1. An apparatus for predicting a fault state of an inverter, the apparatus comprising:
an inverter converting DC power into AC power;
a switching element provided in the inverter; and
a controller extracting a fault sign factor based on an output signal output from the inverter and predicting a fault of the switching element based on the fault sign factor,
wherein the controller includes,
a collection unit collecting the output signal output to the inverter,
an extraction unit extracting the fault sign factor including at least one of threshold voltage, a first on time, and a second on time from the output signal, and
a fault diagnosing unit predicting the fault of the switching element based on the fault sign factor, and
wherein the fault diagnosing unit determines whether the first on time is equal to or more than a first reference value, determines whether the first on time is equal to or more than a second reference value when the first on time is equal to or more than the first reference value, and diagnoses a state of the switching element as a first deterioration state when the second on time is less than the second reference value.

2. The apparatus of claim 1, wherein the threshold voltage is voltage between a gate and an emitter of the switching element, which is required for turning on the switching element.

3. The apparatus of claim 1, wherein the first on time is a time required for the switching element to be turned on when a signal having a square waveform is input in the gate of the switching element.

4. The apparatus of claim 1, wherein the second on time is a time required for the switching element to be turned on when a signal having a triangular waveform is input in the gate of the switching element.

5. The apparatus of claim 1, wherein the fault diagnosing unit determines whether the threshold voltage is equal to or less than a third reference value when the second on time is equal to or more than the second reference value and diagnoses the state of the switching element as a second deterioration state when the threshold voltage is more than a third reference value.

6. The apparatus of claim 5, wherein the fault diagnosing unit diagnoses the state of the switching element as a third deterioration state when the threshold voltage is equal to or less than the third reference value.

7. The apparatus of claim 1, wherein the controller determines that the switching element is in a fault state when output current of the output signal is equal to or more than reference current.

8. The apparatus of claim 1, wherein the switching element is an insulated gate bipolar transistor (IGBT).

9. The apparatus of claim 1, wherein the controller controls a warning unit to output result information to predict the fault of the switching element.

10. A method for predicting a fault state of an inverter, the method comprising:
  collecting an output signal output from an IGBT provided in the inverter;
  extracting a fault sign factor including at least one of threshold voltage, a first on time, and a second on time from the output signal; and
  predicting a fault of the IGBT based on the fault sign factor,
  wherein the predicting of the fault of the IGBT based on the fault sign factor includes,
    determining whether the first on time is equal to or more than a first reference value,
    determining whether the second on time is equal to or more than a second reference value when the first on time is equal to or more than the first reference value, and
    diagnosing a state of the IGBT as a first deterioration state when the second on time is less than the second reference value.

11. The method of claim 10, wherein the threshold voltage is voltage between a gate and an emitter of the IGBT, which is required for turning on the IGBT.

12. The method of claim 10, wherein the first on time is a time when the IGBT is turned on when a signal having a square waveform is input in the gate of the IGBT and the second on time is a time when the IGBT is turned on when the signal having the square waveform is input in the gate of the IGBT.

13. The method of claim 10, wherein the predicting of the fault of the IGBT based on the fault sign factor further includes,
  determining whether the threshold voltage is equal to or less than a third reference value when the second on time is equal to or more than the second reference value, and
  diagnosing a state of the IGBT as a second deterioration state when the threshold voltage is more than the third reference value.

14. The method of claim 13, wherein the predicting of the fault of the IGBT based on the fault sign factor further includes,
  diagnosing the state of the IGBT as a third deterioration state when the threshold voltage is equal to or less than the third reference value.

15. The method of claim 10, wherein the predicting of the fault of the IGBT based on the fault sign factor includes,
  determining that the IGBT is in the fault state when output current of the fault sign factor is equal to or more than reference current.

16. The method of claim 10, further comprising outputting result information to predict the fault of the IGBT.

* * * * *